(12) United States Patent
Kamiyama

(10) Patent No.: US 10,553,523 B2
(45) Date of Patent: Feb. 4, 2020

(54) SEMICONDUCTOR DEVICE

(71) Applicant: SHINDENGEN ELECTRIC MANUFACTURING CO., LTD., Tokyo (JP)

(72) Inventor: Yoshihiro Kamiyama, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 35 days.

(21) Appl. No.: 15/544,235

(22) PCT Filed: Nov. 20, 2015

(86) PCT No.: PCT/JP2015/082712
§ 371 (c)(1),
(2) Date: Jul. 17, 2017

(87) PCT Pub. No.: WO2017/085866
PCT Pub. Date: May 26, 2017

(65) Prior Publication Data
US 2018/0269132 A1 Sep. 20, 2018

(51) Int. Cl.
*H01L 23/48* (2006.01)
*H01L 25/07* (2006.01)
(Continued)

(52) U.S. Cl.
CPC .......... *H01L 23/481* (2013.01); *H01L 24/16* (2013.01); *H01L 25/07* (2013.01); *H01L 25/18* (2013.01);
(Continued)

(58) Field of Classification Search
CPC ...................................................... H01L 25/07
See application file for complete search history.

(56) References Cited

U.S. PATENT DOCUMENTS 5,521,427 A 5/1996 Chia et al.
2017/0229428 A1* 8/2017 Muto ................... H01L 23/28

FOREIGN PATENT DOCUMENTS

JP  S63105355 U  7/1988
JP  H02020318 U  2/1990
(Continued)

OTHER PUBLICATIONS

H02020318U, JP; Feb. 9, 1990; Google Translate.*
(Continued)

*Primary Examiner* — Moazzam Hossain
*Assistant Examiner* — Omar F Mojaddedi
(74) *Attorney, Agent, or Firm* — Ladas & Parry, LLP

(57) ABSTRACT

A semiconductor device (100) comprises a main body portion (50), a semiconductor element (51), a sealing portion (60) and a first lead (10). The first lead (10) has a first base end portion (11) provided along the first direction, a protruding portion (12) protruding from the first base end portion (11) in a second direction different and having a positioning hole (13) formed therein, and a first tip end portion (17) provided in the first base end portion (11) via a bent portion (15). A slit (14) is formed in the protruding portion (12), and a positioning hole side end portion (13a) on the first base end portion (11) side of the positioning hole (13) is positioned on or more on the side opposite to the bent portion (15) than a straight line extending along the first direction from a bent-portion-side slit side end portion (14a) of the slit (14).

7 Claims, 10 Drawing Sheets

(51) Int. Cl.
*H01L 25/18* (2006.01)
*H01L 23/00* (2006.01)

(52) U.S. Cl.
CPC ............... *H01L 2224/48221* (2013.01); *H01L 2224/4903* (2013.01); *H01L 2224/49111* (2013.01)

(56) References Cited

FOREIGN PATENT DOCUMENTS

| JP | H04129259 A | 4/1992 |
| JP | 2002118341 A | 4/2002 |
| JP | 2002305280 A | 10/2002 |
| JP | 2003197469 A | 7/2003 |
| JP | 2015120367 A | 7/2017 |

OTHER PUBLICATIONS

English translation from WIPO of PCT International Written Opinion for PCT/JP2015/082712 dated Jan. 26, 2016.
PCT International Preliminaly Report on Patentability (Chapter I) with Written Opinion from PCT/JP2015/082712 dated May 22, 2018, and its English translation from WIPO.
International Search Report for PCT/JP2015/082712 dated Jan. 26, 2016 and its English translation provided by WIPO.
Written Opinion for PCT/JP2015/082712 dated Jan. 26, 2016 and its English translation provided by Google Translate.

* cited by examiner (a)

(b)

SEMICONDUCTOR DEVICE

CROSS-REFERENCE TO RELATED APPLICATIONS

This application is the U.S. national phase of PCT Application PCT/JP2015/082712 filed on Nov. 20, 2015, the disclosure of which is incorporated herein by reference in its entirety.

TECHNICAL FIELD

The present invention relates to a semiconductor device.

BACKGROUND ART

Conventionally, a semiconductor device including a power module or the like is fixed inside a heat sink or a housing which is an external member. When a semiconductor device is fixed inside, for example, a housing in this way, a screw is used, for example. However, while a through hole through which the screw passes is being aligned with a screw hole, the semiconductor device easily moves with respect to the housing. This causes an issue such as a reduction in the efficiency of assembly work. In order to solve such inconvenience, a configuration disclosed in JP 2015-120367 A has been proposed. A semiconductor device disclosed in this JP 2015-120367 A has positioning means that position the semiconductor device with respect to a housing before the semiconductor device is fixed to the housing. In addition, the positioning means disclosed therein include their respective positioning protrusions and positioning terminals. The positioning protrusions are provided inside side wall portions of the housing. The positioning terminals are provided in their respective power modules and have fitting holes into which their respective positioning protrusions fit. However, in providing positioning terminals as in JP 2015-120367 A, spaces for providing the positioning terminals are necessary. This leads to an increase in the external size of a semiconductor device.

It is known that slits are provided on both sides of or around their respective screw holes included in a thick metal plate constituting a lead frame (JP 2002-305280 A). However, the slits employed in this JP 2002-305280 A are merely used for processing to extrude a corresponding area surrounded by the slits.

SUMMARY OF INVENTION

Technical Problem

Accordingly, an object of the present invention is to provide a semiconductor device that can be positioned with high precision without increasing the external size thereof, when the semiconductor device is fixed to an external member.

Solution to Problem

A semiconductor device according to the present invention comprises:
a main body portion;
a semiconductor element which is mounted on the main body portion;
a sealing portion which covers the main body portion and the semiconductor element with a sealing resin and which is fixed to an external member; and
a first lead which is electrically connected to the semiconductor element, and protrudes in a first direction, outward from the sealing portion;
wherein the first lead has a first base end portion which is provided along the first direction, a protruding portion which protrudes from the first base end portion in a second direction different from the first direction, and has a positioning hole formed therein, into which a positioning protrusion can be inserted, and a first tip end portion which is provided in the first base end portion via a bent portion, which extends in a direction different from the first direction and the second direction and which is for electrically connecting to an external circuit,
wherein a slit is formed in the protruding portion, and
wherein a center of the positioning hole is positioned more on the side opposite to the bent portion than the straight line extending along the first direction from the bent-portion-side slit side end portion of the slit.

In the semiconductor device according to the present invention,
a positioning hole side end portion on a first base end portion side of the positioning hole may be positioned on the straight line extending along the first direction from the bent-portion-side slit side end portion of the slit or more on the side opposite to the bent portion than the straight line.

In the semiconductor device according to the present invention,
the slit may be provided adjacent to the bent portion in the second direction.

The semiconductor device, according to the present invention, may further comprise a second lead which protrudes outward from the sealing portion and is arranged side by side with the first lead along one side face of the sealing portion,
wherein the first lead may be positioned more on an end side than the second leads in a width direction of the one side face.

In the semiconductor device according to the present invention,
the protruding portion may protrude from the first base end portion in a direction in which the second leads do not exist.

The semiconductor device, according to the present invention, may further comprise a second lead which protrudes outward from the sealing portion and is arranged side by side with the first lead along one side face of the sealing portion,
wherein a width of the first base end portion of the first lead may be the same size as a width of base end portion of the second lead.

The semiconductor device, according to the present invention, may further comprise a second lead which protrudes outward from the sealing portion and is arranged side by side with the first lead along one side face of the sealing portion,
wherein two first leads may be provided,
wherein one of the first leads may be positioned on one end side in a width direction of the second lead,
wherein the other one of the first leads may be positioned on the other end side in the width direction of the second lead,
wherein each protruding portion may protrude from the first base end portion in a direction in which the second leads do not exist.

Advantageous Effects of Invention

According to the present invention, the first lead electrically connected to the corresponding semiconductor element and the external circuit is provided. Accordingly, additionally providing a positioning terminal which is not electrically connected to the semiconductor element as in JP 2015-120367 A is not necessary. Therefore, the external size can be comparable with that of a conventional one (the external size can be smaller than that of the semiconductor device disclosed in JP 2015-120367 A). Furthermore, since the slit is provided in the protruding portion, and the center of the positioning hole is positioned more on the side opposite to the bent portion than the straight line extending along the first direction from the bent-portion-side slit side end portion of the slit, it is possible to prevent, upon forming the bent portion by bending, the distortion of the shape of the positioning hole formed in the protruding portion. Therefore, the deformation of the positioning hole due to bending processing for forming the bent portion can be suppressed in the semiconductor device according to the present invention. As a result, it is possible to perform positioning using the positioning hole with high precision.

DESCRIPTION OF EMBODIMENTS

First Embodiment

<<Configuration>>

Figure 1:
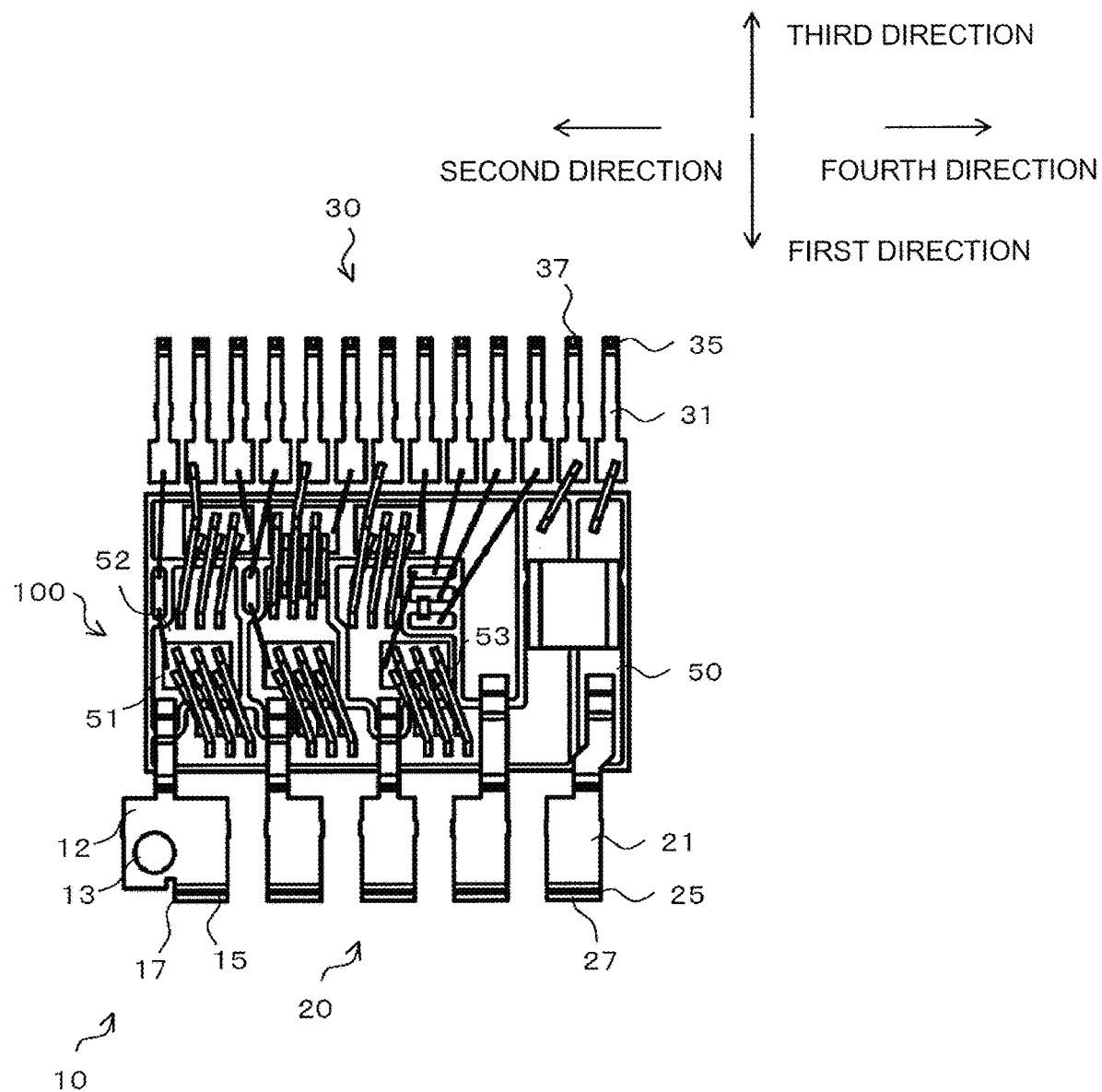
FIG. 1 is a plan view of a semiconductor device according to a first embodiment of the present invention without being sealed with a resin.

As illustrated in FIG. 1, a semiconductor device 100 according to the present embodiment has a main body portion 50 and a plurality of semiconductor elements 51. The plurality of semiconductor elements 51 is mounted on the main body portion 50 via a plurality of conductive layers 52. The semiconductor device 100 also has a sealing portion 60 (refer to FIG. 2) and a first lead 10 (refer to FIG. 1). The sealing portion 60 covers the main body portion 50 and the semiconductor elements 51 with a sealing resin 62 and is fixed to an external member. The first lead 10 (refer to FIG. 1) is electrically connected to the corresponding semiconductor element 51, and protrudes outward, i.e., in a first direction, from the sealing portion 60. It is to be noted that the semiconductor elements 51, the first lead 10, and second leads 20 and third leads 30 to be described later are electrically connected by being connected via conductive layers 52, wires 53, and the like. The main body portion 50 according to the present embodiment has a plate shape. The plurality of semiconductor elements 51 is mounted on the plate-shaped main body portion 50. In the present embodiment, the "first direction" indicates a "lower direction" of FIG. 1.

Figure 2:
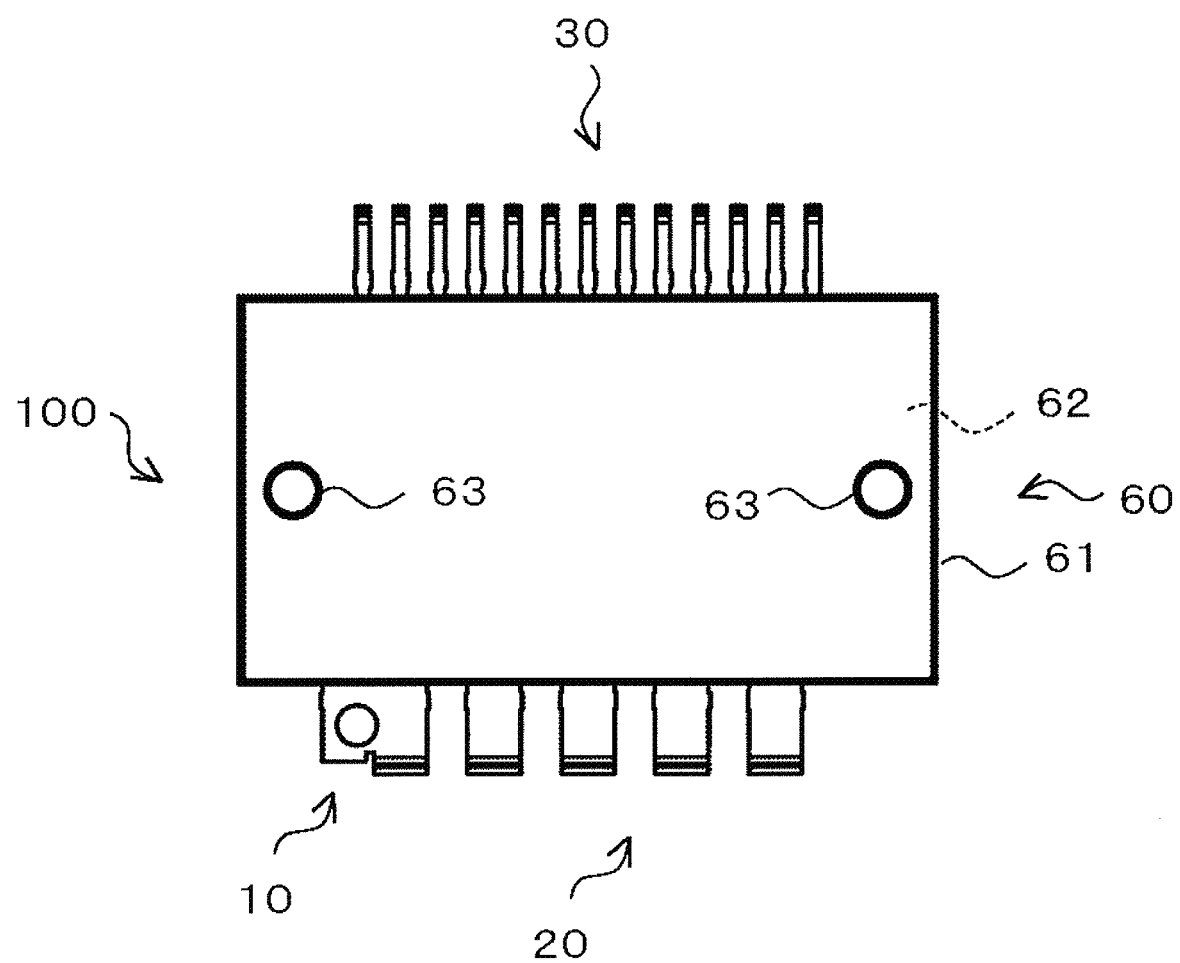
FIG. 2 is a plan view of the semiconductor device according to the first embodiment of the present invention.

As illustrated in FIG. 2, the sealing portion 60 has a frame body 61 and the sealing resin 62 filled in the frame body 61. Through holes 63 are provided in the frame body 61. Fixing members 230 such as screws (refer to FIG. 4) are inserted into the respective through holes 63 to fix the frame body 61 to the external member. An example of the external member can include a housing 200 (refer to FIG. 4) to be mounted in a vehicle. Although the housing 200 is used as the external member in the description of the present embodiment, the external member is not limited thereto.

Figure 3:
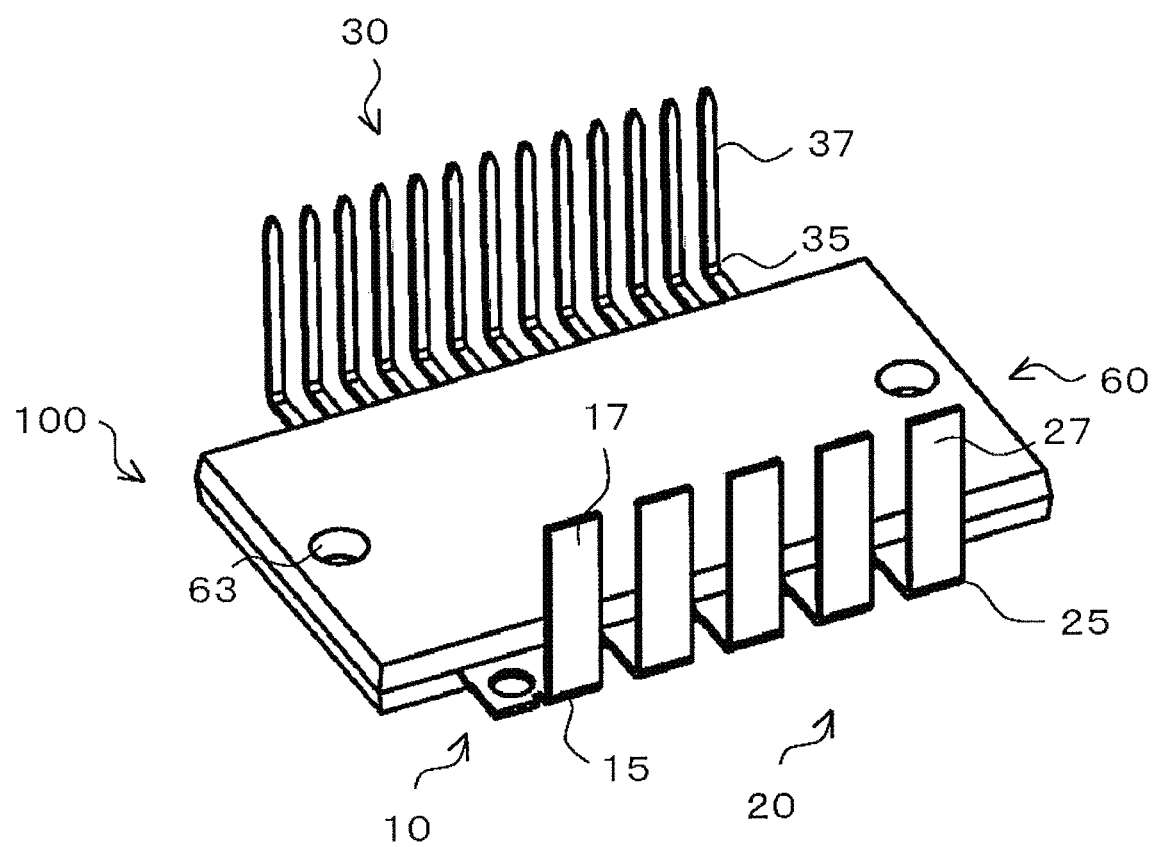
FIG. 3 is a perspective view of the semiconductor device according to the first embodiment of the present invention.
Figure 4:
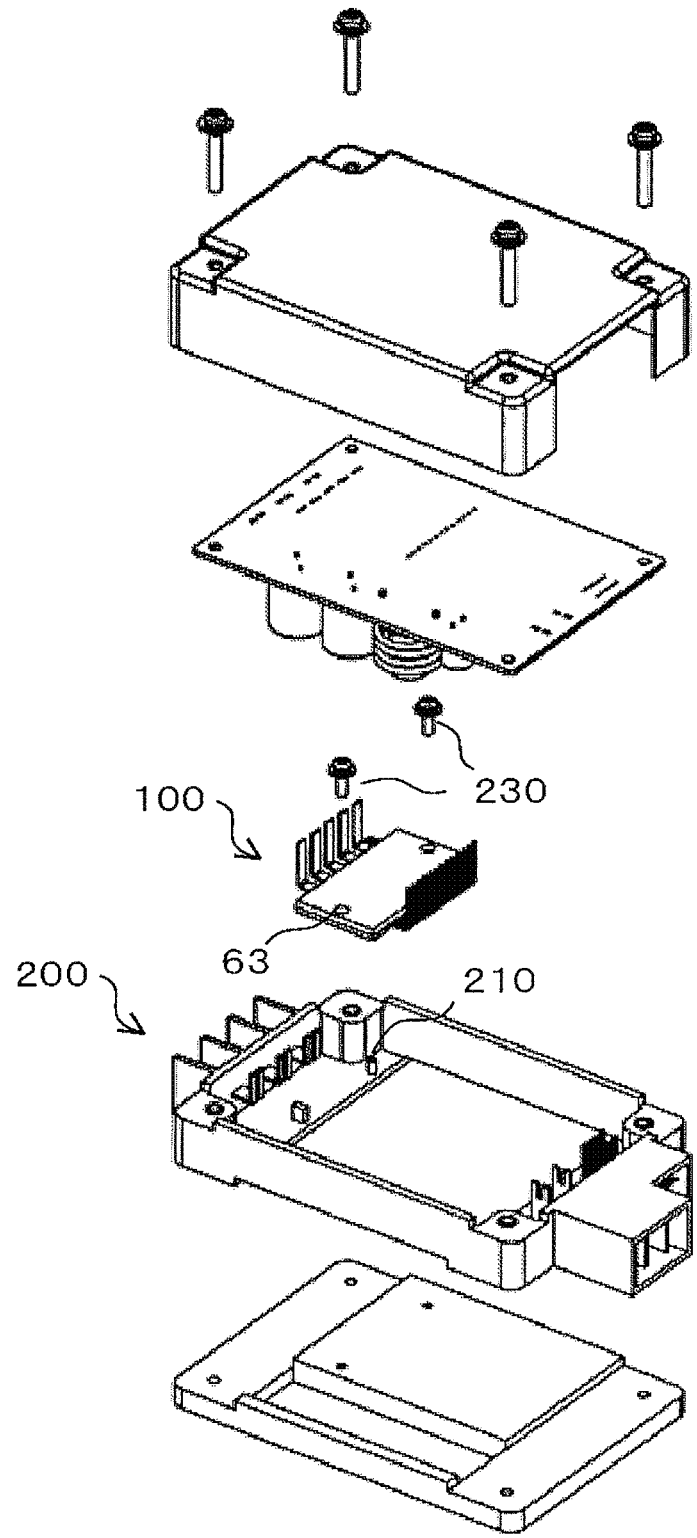
FIG. 4 is an assembly view of the semiconductor device according to the first embodiment of the present invention when being mounted in a housing.
Figure 5:
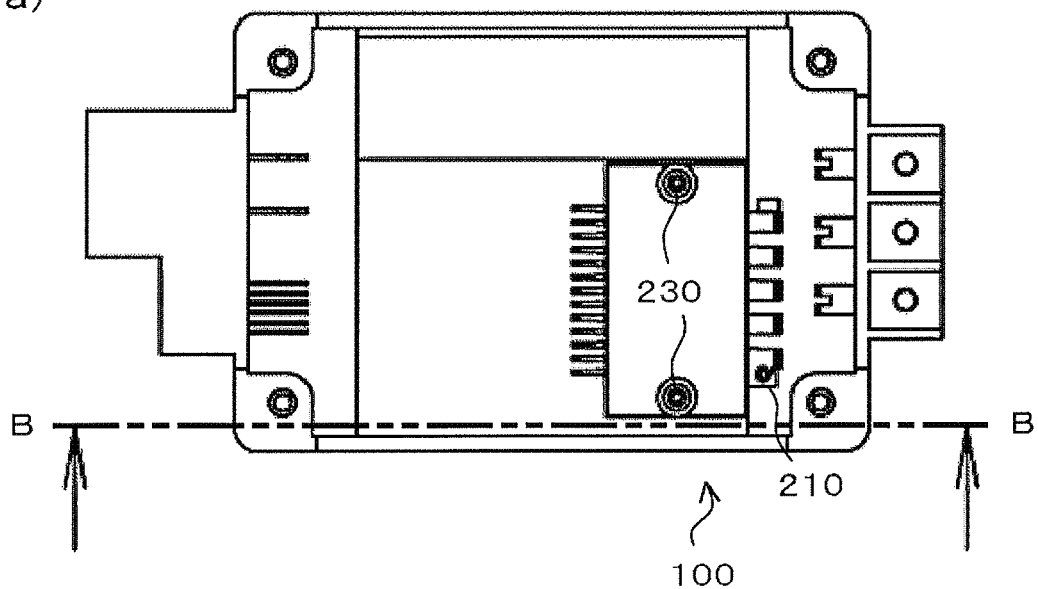
FIG. 5(a) is a plan view of the semiconductor device according to the first embodiment of the present invention after mounted in the housing.
FIG. 5(b) is a cross-sectional view of FIG. 5(a) taken along line B-B.
Figure 5:
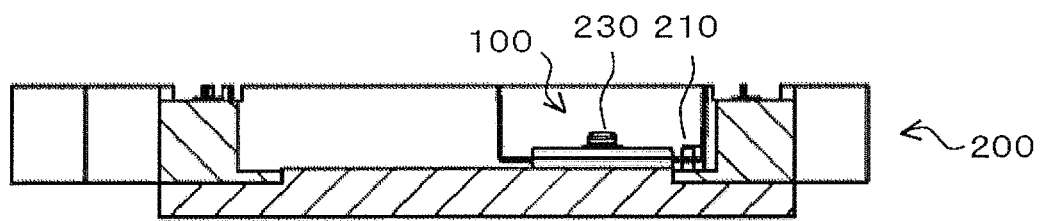
Figure 6:
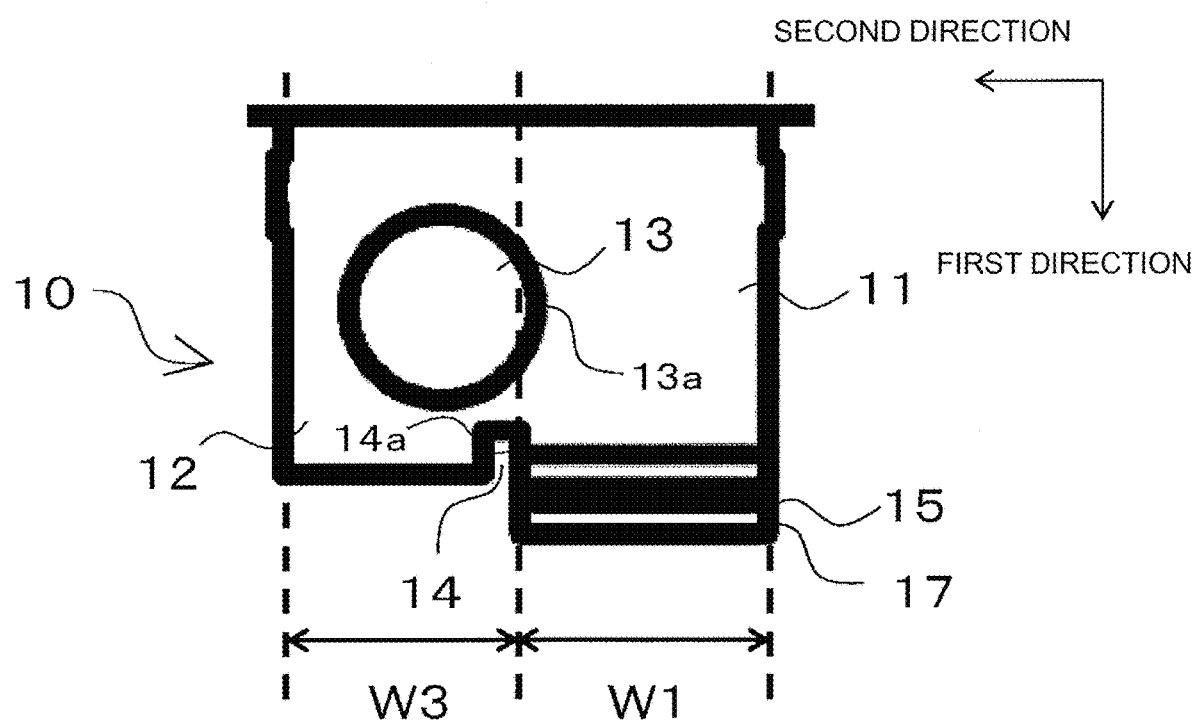
FIG. 6 is an enlarged plan view of a vicinity of a positioning hole of the semiconductor device according to an example of the first embodiment of the present invention.
Figure 7:
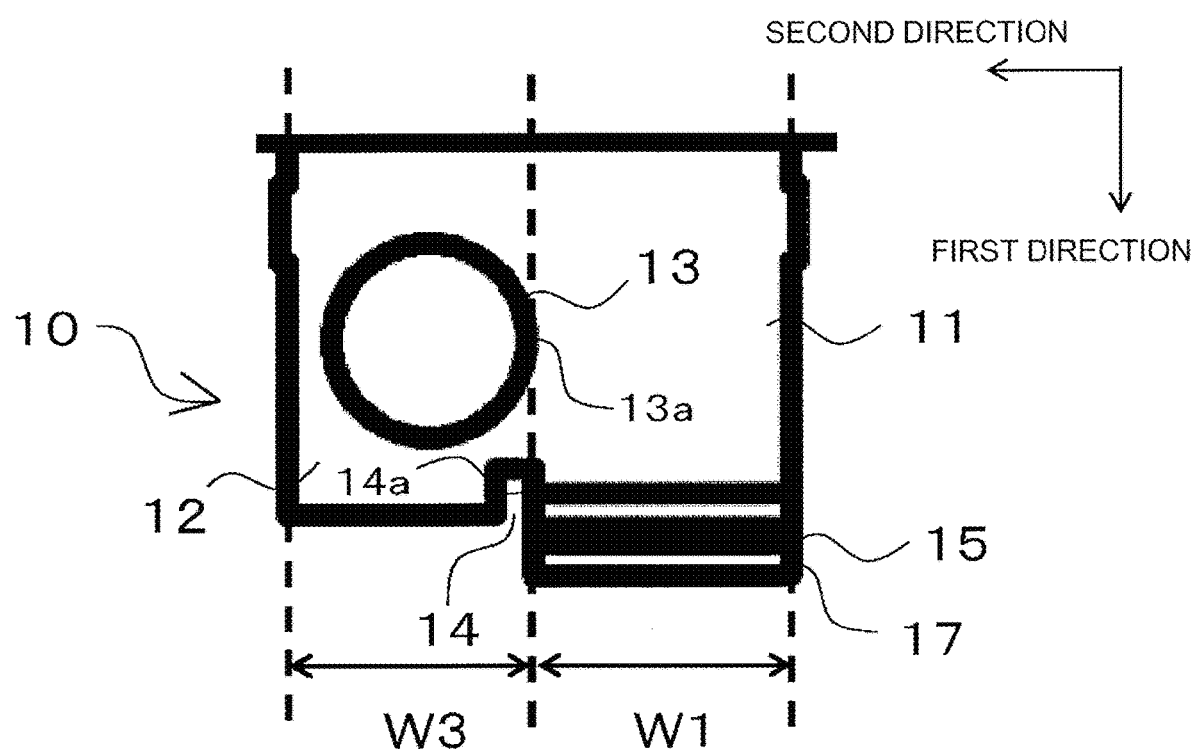
FIG. 7 is an enlarged plan view of a vicinity of a positioning hole of the semiconductor device according to another example of the first embodiment of the present invention.

The first lead 10 according to the present embodiment has a plate shape. As illustrated in FIGS. 6 and 7, the first lead 10 has a first base end portion 11, a protruding portion 12, and a first tip end portion 17. The first base end portion 11 is provided along the first direction. The protruding portion 12 protrudes from the first base end portion 11 in a second direction different from the first direction, and has a positioning hole 13 formed therein, into which a positioning protrusion 210 (refer to FIG. 4 and FIG. 5) can be inserted. The first tip end portion 17, which is for electrically connecting to an external circuit, is provided in the first base end portion 11 via a bent portion 15, and extends in a direction different from the first direction and the second direction. In the present embodiment, the "second direction" indicates a "left direction" of FIG. 1. In addition, as illustrated in FIG. 3 as an example, the first tip end portion 17 extends in a direction orthogonal to the first direction and the second direction. The positioning protrusion 210 illustrated in FIG. 4 and FIG. 5 is formed of, for example, a resin material. The positioning protrusion 210 is slightly smaller than the positioning hole 13. The semiconductor device 100 may be rotatable in a state where the positioning protrusion 210 is inserted into the positioning hole 13. In addition, when the positioning protrusion 210 having a tapered shape is inserted into the positioning hole 13, an inner peripheral surface of the positioning hole 13 and an outer peripheral surface of the positioning protrusion 210 may contact with each other. Furthermore, the semiconductor device 100 may be rotatable in such a state.

As illustrated in FIGS. 6 and 7, a slit 14 is formed in the protruding portion 12 of the first lead 10. A positioning hole side end portion 13a on the first base end portion 11 side of the positioning hole 13 may be positioned on a straight line extending along the first direction (refer to FIG. 7) from a bent-portion-side slit side end portion 14a of the slit 14 or more on the side opposite to the bent portion 15 than the straight line. It is to be noted that positioning the positioning hole side end portion 13a on the first base end portion 11 side on the straight line extending along the first direction from the bent-portion-side slit side end portion 14a indicates that for example, when the center of the "straight line extending along the first direction" having a thickness of 1/50 of the width (the length in the horizontal direction of FIGS. 6 and 7) of the first lead 10 is positioned in the bent-portion-side slit side end portion 14a, the positioning hole side end portion 13a on the first base end portion 11 side is positioned on the straight line. In addition, the "straight line extending along the first direction" is the same meaning as a straight line extending along a "third direction" to be described later. Therefore, the wording "straight line extending along the first direction" is used in the present embodiment.

As illustrated in FIGS. 6 and 7, the slit 14 may be provided adjacent to the bent portion 15 in the second direction. In addition, the length of the slit 14 can be, for example, ½5 to ⅕ of the length of the first base end portion 11 protruding outward from the sealing portion 60. By increasing the length of the slit 14, it is possible to enhance the effect of suppressing the deformation of the positioning hole 13 to be described later. On the other hand, by decreasing the length of the slit 14, it is possible to adopt a large positioning hole 13 without increasing the length of the first base end portion 11 protruding outward from the sealing portion 60.

In the present embodiment, as illustrated in FIGS. 1 to 3, the second leads 20 are provided. The second leads 20 protrude outward from the sealing portion 60 and are arranged side by side with the first lead 10 along one side face (the lower side face in FIG. 1) of the sealing portion 60. In addition, the first lead 10 is positioned more on an end side than the second leads 20 in a width direction of the one side face. More specifically, the plurality (four) of second leads 20 are provided in the present embodiment. In addition, the first lead 10 is provided more on the left side of FIG. 1, which is one of the end sides in the width direction, than the second leads 20.

Figure 8:
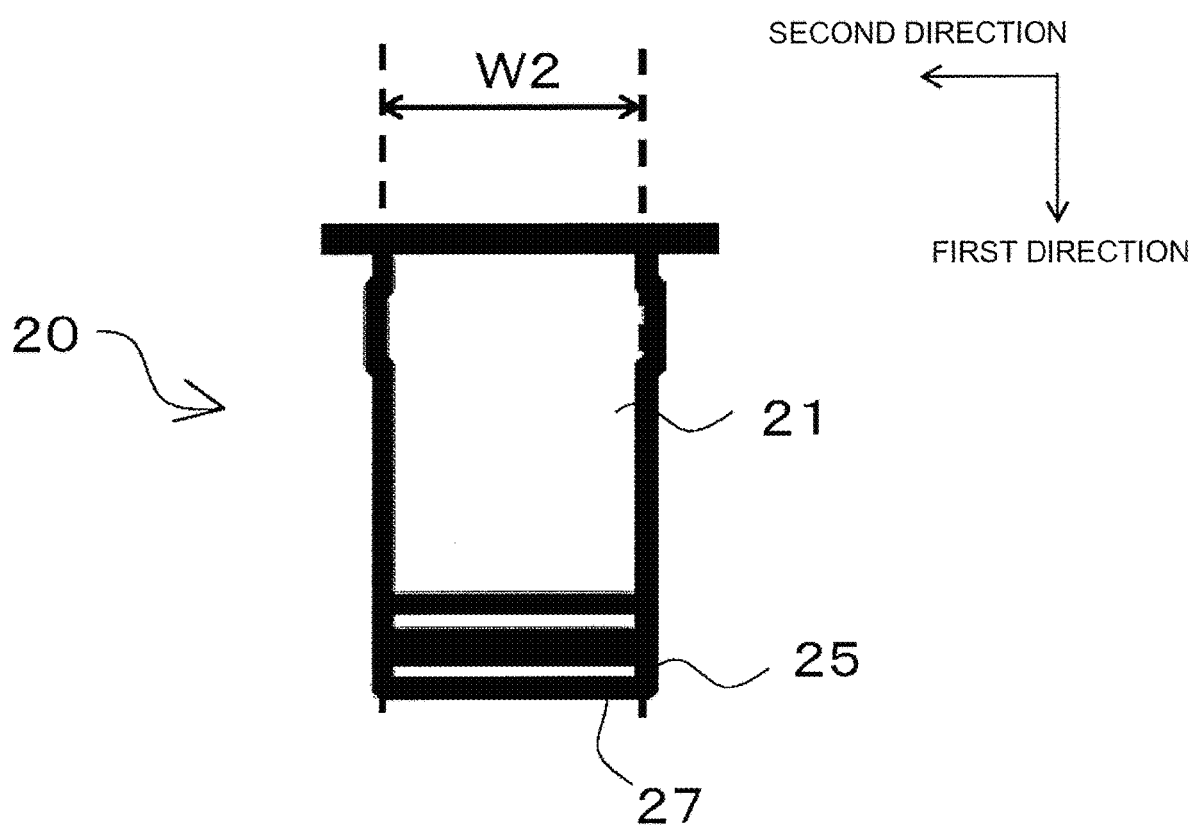
FIG. 8 is an enlarged plan view of a second lead according to the first embodiment of the present invention.

The second leads 20 according to the present embodiment have a plate shape. As illustrated in FIG. 8, each of the second leads 20 may have a second base end portion 21 and a second tip end portion 27. The second base end portion 21 is provided along the first direction. The second tip end portion 27, which is for electrically connecting to the external circuit, is provided on the second base end portion 21 via a bent portion 25, and extends in a direction different from the first direction and the second direction. As illustrated in FIG. 3 as an example, the second tip end portions 27 extend in a direction orthogonal to the first direction and the second direction and in parallel with the first tip end portion 17 in the present embodiment.

The protruding portion 12 may protrude from the first base end portion 11 in a direction in which the second leads 20 do not exist. In the mode illustrated in FIG. 1, the protruding portion 12 protrudes from the first base end portion 11 in the left direction of FIG. 1.

A width W1 (refer to FIGS. 6 and 7) of the first base end portion 11 of the first lead 10 may be the same size as a width W2 (refer to FIG. 8) of each second base end portion 21. The width W1 of the first base end portion 11 is not limited thereto, and may be larger or smaller than the width W2 of each second base end portion 21. It is to be noted that in the present embodiment, the width W1 of the first base end portion 11 is the same size as the width of the bent portion 15 of the first lead 10, and the width W2 of each second base end portion 21 is the same size as the width of the bent portion 25 of the corresponding second lead 20. It is to be noted that in the present embodiment, "the same size" indicates that the size is within ±5% with respect to the total size. That is, it is indicated that when the width W1 of the first base end portion 11 is the same size as the width W2 of each second base end portion 21, the W1 is within the range of 0.95×W2 to 1.05×W2.

In addition, a width W3 (refer to FIGS. 6 and 7) of the protruding portion 12 may be smaller or larger than the width W1 of the first base end portion 11. Furthermore, the width W3 of the protruding portion 12 may be the same size as the width W1 of the first base end portion 11. It is to be noted that the width W3 of the protruding portion 12 may be determined on the basis of the size of the positioning hole 13. When the size of the positioning hole 13 is small, the width W3 of the protruding portion 12 can be reduced, and the size of the first lead 10 in the width direction can be reduced.

As illustrated in FIGS. 1 to 3, the third leads 30 may be provided. The third leads 30 protrude outward from the sealing portion 60 and are provided along the other side face of the sealing portion 60. The sealing portion 60 according to the present embodiment has a substantially rectangular shape. In addition, "the other side face" in the present embodiment indicates the side face opposed to the "one side face", indicating the upper side face in FIG. 1. As illustrated in FIG. 1, the plurality of third leads 30 may be provided.

Each of the third leads 30 may have a third base end portion 31 and a third tip end portion 37. The third base end portion 31 is provided along the third direction (upper direction of FIG. 1) which is a direction opposite to the first direction. The third tip end portion 37, which is for electrically connecting to the external circuit, is provided on the third base end portion 31 via a bent portion 35, and extends in a direction different from the third direction and the second direction. As illustrated in FIG. 3 in the present embodiment, the third tip end portions 37 extend in a direction orthogonal to the third direction and the second direction and in parallel with the first tip end portion 17 and the second tip end portions 27. It is to be noted that in FIG. 1, a direction opposite to the second direction is illustrated as a fourth direction.

In the present embodiment, the width of each third base end portion 31 is narrower than the width W2 of each second base end portion 21. Furthermore, the number of third leads 30 is greater than the total number of first lead 10 and second leads 20. However, these are merely examples, and the width of each third base end portion 31 may be larger than the width W2 of each second base end portion 21. The number of third leads 30 may be smaller than the total number of the first lead 10 and the second leads 20.

Figure 9:
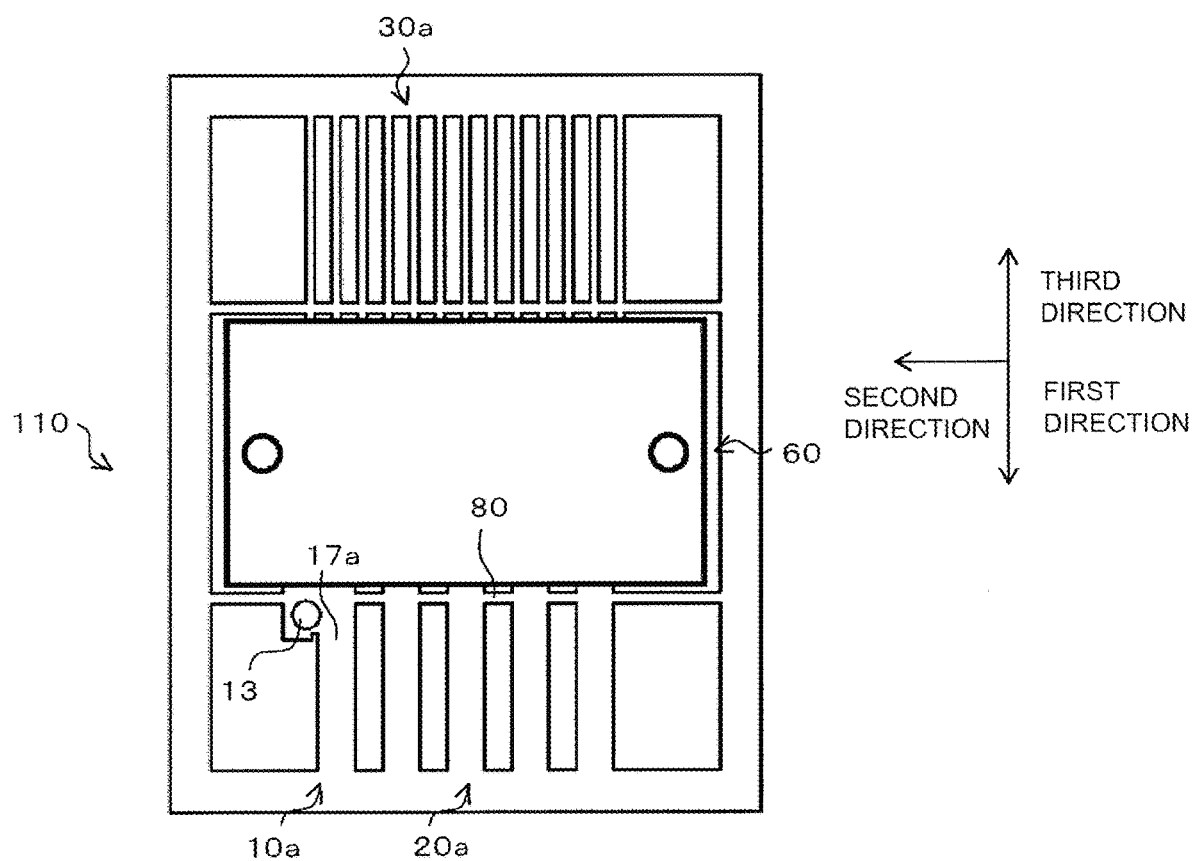
FIG. 9 is a plan view of a first lead, second leads, and third leads according to the first embodiment of the present invention before being formed by cutting.

FIG. 9 illustrates a plan view of members before the first lead 10, the second leads 20, and the third leads 30 are formed by cutting. Pre-first lead 10a, pre-second leads 20a, and pre-third leads 30a having a flat plate shape are formed on a lead frame 110 having a flat plate shape in this manner.

As illustrated in FIG. 9, the positioning hole 13 may be positioned more on the first direction side (the lower side of FIG. 9) than a tie bar 80, and more on the third direction side (the upper side of FIG. 9) than a position 17a where the bent portion 15 is to be formed. It is to be noted that in forming the bent portions 15, 25, 35, for example, the tip end side just needs to be bent at substantially 90 degrees while the base end portions 11, 21, 31 are sandwiched with a holding portion which is not illustrated.

<<Functions and Effects>>

Next, among the functions and effects of the present embodiment having the above-described configuration, functions and effects which have not been described yet will be described.

According to the present embodiment, the first lead 10 electrically connected to the corresponding semiconductor element 51 and the external circuit is provided. Accordingly, additionally providing a positioning terminal which is not electrically connected to the semiconductor element 51 as in JP 2015-120367 A is not necessary. Therefore, the external size can be comparable with that of a conventional one (the external size can be smaller than that of the semiconductor device disclosed in JP 2015-120367 A). Furthermore, since the slit 14 is provided in the protruding portion 12, and the center of the positioning hole 13 is positioned more on the side opposite to the bent portion 15 than the straight line extending along the first direction from the bent-portion-side slit side end portion 14a of the slit 14, it is possible to prevent, upon forming the bent portion 15 by bending, the distortion of the shape of the positioning hole 13 formed in the protruding portion 12. Therefore, the deformation of the positioning hole 13 due to bending processing for forming the bent portion 15 can be suppressed in the semiconductor device 100 according to the present embodiment. As a result, it is possible to perform positioning using the positioning hole 13 with high precision. It is to be noted that the ability to perform high-precision positioning as in the present embodiment contributes to speedy manufacturing and assembly, and is much sought-after, particularly in the mass production of vehicles and the like.

In the present embodiment, in the case of adopting the mode (refer to FIG. 7) in which the positioning hole side end portion 13a on the first base end portion 11 side is positioned on the straight line extending along the first direction from the bent-portion-side slit side end portion 14a or more on the side opposite to the bent portion 15 than the straight line, it is possible to more assuredly make the slit 14 prevent a force from applying to the entire positioning hole 13. Accordingly, it is possible to more assuredly prevent the shape of the positioning hole 13 from being distorted upon forming the bent portion 15 by bending.

In particular, as illustrated in FIG. 7, in the case of adopting the mode in which the positioning hole side end portion 13a on the first base end portion 11 side is positioned "on the straight line" extending along the first direction from the bent-portion-side slit side end portion 14a, there is an advantage that it is possible to more assuredly prevent the shape of the positioning hole 13 from being distorted and reduce the size of the protruding portion 12 in the width direction (the second direction) as much as possible.

In the present embodiment, as illustrated in FIGS. 6 and 7, in the case of adopting the mode in which the slit 14 is provided adjacent to the bent portion 15 in the second direction, the stress being applied upon forming the bent portion 15 by bending can be efficiently shielded with the slit 14 adjacent thereto. Furthermore, with the slit 14 provided adjacent to the bent portion 15 as described above, the size of the protruding portion 12 in the width direction (second direction) can be reduced as much as possible.

In the present embodiment, as illustrated in FIGS. 1 and 2, in the case of adopting the mode in which the first lead 10 is positioned more on the end side than the second leads 20 in the width direction (the left side of FIGS. 1 and 2) of the one side face, the first lead 10 and the (plurality of) second leads 20 can be evenly arranged. Furthermore, since there is a vacant space in the end portion in the width direction, the first lead 10 is arranged in the end portion in the width direction (the left end portion in FIGS. 1 and 2). This is advantageous in terms of miniaturizing the semiconductor device 100.

In the present embodiment, as illustrated in FIGS. 1 and 2, in the case of adopting the mode in which the protruding portion 12 protrudes from the first base end portion 11 in a direction in which the second leads 20 do not exist, the protruding portion 12 is positioned in the end portion in the width direction. Accordingly, the first base end portion 11 of the first lead 10 and the second base end portions 21 of the (plurality of) second leads 20 can be evenly arranged.

In the present embodiment, in the case of adopting the mode in which the width W1 of the first base end portion 11 is the same size as the width W2 of each second base end portion 21, the resistances of the first lead 10 and the second leads 20 can be expected to be approximately the same value. This is because it is assumed that even when a voltage is applied, not a substantial amount of current flows through the protruding portion 12 where the positioning hole 13 is formed. In this way, by setting the resistances of the first lead 10 and the second leads 20 to approximately the same value, there is an advantage that the semiconductor device 100 can be designed and manufactured with the first lead 10 having substantially the same performance as the second leads 20.

As illustrated in FIG. 9, when the positioning hole 13 is positioned more on the first direction side (the lower side of FIG. 9) than the tie bar 80, it is possible to prevent a resin from leaking through the positioning hole 13 while the resin for forming the sealing resin 62 of the sealing portion 60 is injected. It is to be noted that with the positioning hole 13 positioned more on the third direction side (upper side of FIG. 9) than the position 17a where the bent portion 17 is to be formed, it is possible to prevent the distortion of the positioning hole 13 upon forming the bent portion 17.

Second Embodiment

Next, the second embodiment according to the present invention will be described.

Figure 10:
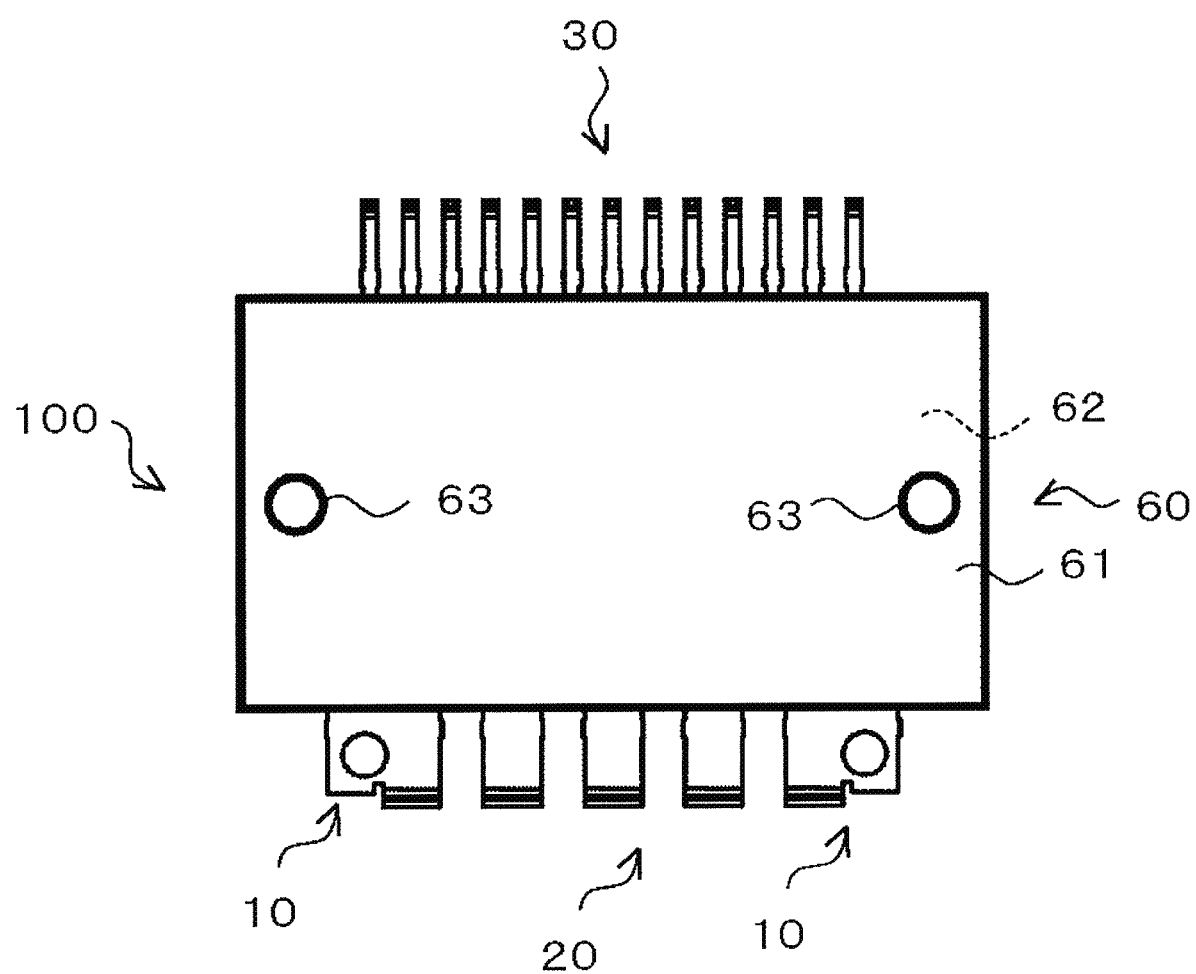
FIG. 10 is a plan view of a semiconductor device according to a second embodiment of the present invention.

As illustrated in FIG. 10, two first leads 10 are provided in the second embodiment. Furthermore, one of the first leads 10 is positioned on one end side in a width direction (the left side of FIG. 10) of second leads 20. The other one of the first leads 10 is positioned on the other end side in the width direction (the right side of FIG. 10) of the second leads 20. Each protruding portion 12 protrudes from a corresponding first base end portion 11 in a direction in which the second leads 20 do not exist. That is, in the first lead 10 positioned on the one end side in the width direction, the protruding portion 12 thereof protrudes from the corresponding first base end portion 11 to the left side of FIG. 10. In the first lead 10 positioned on the other end side in the width direction, the protruding portion 12 thereof protrudes from the corresponding first base end portion 11 to the right side of FIG. 10.

In the second embodiment, other configurations are substantially the same as those of the first embodiment.

Although a description is omitted to avoid duplication, a similar effect to that of the first embodiment can be attained in the present embodiment. Furthermore, according to the present embodiment, the two first leads 10 are provided. Accordingly, when a semiconductor device 100 is attached to a housing 200, positioning can be performed with the two points. As a result, by simply inserting positioning protrusions 210 into respective positioning holes 13, the semiconductor device 100 can be positioned without being rotated. Therefore, speedier and higher positioning effects can be expected. As described above, speedy manufacturing and assembly are much sought-after, particularly in the mass production of vehicles and the like. Therefore, it is highly advantageous to be able to expect speedier and higher positioning effects as in the present embodiment.

Lastly, descriptions on the aforementioned respective embodiments as well as disclosed drawings are merely examples for describing the invention described in CLAIMS. The descriptions on the aforementioned embodiments or disclosed drawings should not be construed to limit the invention described in CLAIMS.

REFERENCE SIGNS LIST

10 First lead
11 First base end portion
12 Protruding portion
13 Positioning hole
13a Positioning hole side end portion
14 Slit
14a Bent-portion-side slit side end portion
15 Bent portion
17 First tip end portion
20 Second lead
50 Main body portion
51 Semiconductor element
60 Sealing portion
62 Sealing resin
63 Through hole
200 Housing (external member)
210 Positioning protrusion
W1 Width of the first base end portion
W2 Width of the second base end portion

What is claimed is:

1. A semiconductor device comprising:
a main body portion;
a semiconductor element which is mounted on the main body portion;
a sealing portion which covers the main body portion and the semiconductor element with a sealing resin and which is fixed to an external member; and
a first lead which is electrically connected to the semiconductor element, and protrudes in a first direction, outward from the sealing portion;
wherein the first lead has a first base end portion which is provided along the first direction, a protruding portion which protrudes from the first base end portion in a second direction different from the first direction and perpendicular to the first direction, and which has a positioning hole formed therein, into which a positioning protrusion can be inserted, and a first tip end portion which is provided in the first base end portion via a bent portion, which extends in a direction different from the first direction and the second direction, perpendicular to the first direction and the second direction, and which is for electrically connecting to an external circuit;
wherein a slit, along the first direction, is formed in the protruding portion adjacent to the bent portion;
wherein a center of the positioning hole is positioned more on the side opposite to the bent portion than a straight line extending in the slit and extending along the first direction from a slit end portion adjacent to the bent portion; and
wherein a part of the protruding portion, which is on the side opposite to the bent portion than the straight line in the slit and extending along the first direction, is not bent.

2. The semiconductor device according to claim 1, wherein a side end portion of the positioning hole on a first base end portion side is positioned on the straight line extending along the first direction from the slit end portion adjacent to the bent portion or more on the side opposite to the bent portion than the straight line.

3. The semiconductor device according to claim 1, wherein the slit is provided adjacent to the bent portion in the second direction.

4. The semiconductor device, according to claim 1, further comprising a second lead which protrudes outward from the sealing portion and is arranged side by side with the first lead along one side face of the sealing portion,
wherein the first lead is positioned more on an end side than the second leads in a width direction of the one side face.

5. The semiconductor device according to claim 4, wherein the protruding portion protrudes from the first base end portion in a direction in which the second leads do not exist.

6. The semiconductor device, according to claim 1, further comprising a second lead which protrudes outward from the sealing portion and is arranged side by side with the first lead along one side face of the sealing portion,
wherein a width of the first base end portion of the first lead is the same size as a width of base end portion of the second lead.

7. The semiconductor device, according to claim 1, further comprising a second lead which protrudes outward from the sealing portion and is arranged side by side with the first lead along one side face of the sealing portion,
wherein two first leads are provided,
wherein one of the first leads is positioned on one end side in a width direction of the second lead,
wherein the other one of the first leads is positioned on the other end side in the width direction of the second lead,
wherein each protruding portion protrudes from the first base end portion in a direction in which the second leads do not exist.

* * * * *